United States Patent [19]

Sarocka et al.

[11] Patent Number: 5,257,409
[45] Date of Patent: Oct. 26, 1993

[54] FREQUENCY SYNTHESIZER WITH PROGRAMMING FEEDBACK

[75] Inventors: Robert J. Sarocka, Lombard; David D. Neperud, Roselle; Peter P. Walter, Schaumburg; Tim J. Manczko, Hanover Park; David H. Spensley, Jr., West Chicago, all of Ill.

[73] Assignee: Motorola, Inc., Schaumburg, Ill.

[21] Appl. No.: 779,553

[22] Filed: Oct. 18, 1991

[51] Int. Cl.$^5$ .............................................. H04B 1/40
[52] U.S. Cl. .................................. 455/76; 455/165.1; 455/183.1; 455/260; 455/265; 331/25; 332/127
[58] Field of Search .................. 455/76, 165.1, 183.1, 455/260, 265; 331/1 A, 25; 332/127

[56] References Cited

U.S. PATENT DOCUMENTS

| | | | |
|---|---|---|---|
| 4,218,657 | 8/1980 | Rast | 455/260 |
| 4,688,261 | 8/1987 | Killoway et al. | 455/76 |
| 4,901,036 | 2/1990 | Herold et al. | 331/25 |
| 4,926,141 | 5/1990 | Herold et al. | 455/260 |
| 5,180,992 | 1/1993 | Akiyama et al. | 331/25 |
| 5,202,906 | 4/1993 | Saito et al. | 331/25 |
| 5,204,978 | 4/1993 | Shimizu | 455/76 |

Primary Examiner—Reinhard J. Eisenzopf
Assistant Examiner—Christine K. Belzer
Attorney, Agent, or Firm—Charles W. Bethards; Donald B. Southard

[57] ABSTRACT

This disclosure discusses a programmable frequency synthesizer arrangement having programming feedback capability used to avoid undesirable operation due to random hard and soft faults. The arrangement operates by supplying appropriate programming information, receiving the same, subject to random hard or soft faults, and, in response, directing the operation of a frequency synthesizer (10). The feedback capability is accomplished by generating a feedback signal (35, 36) indicative of the programming information as applied to the frequency synthesizer, generating a reference signal representative of the appropriate programming information, comparing the two signals, and blocking undesirable operation of the frequency synthesizer if the comparison indicates the occurrence of a random hard or soft fault. Further disclosed is a wireless communications transceiver with the programmable frequency synthesizer arrangement.

19 Claims, 3 Drawing Sheets

5,257,409

FREQUENCY SYNTHESIZER WITH PROGRAMMING FEEDBACK

BACKGROUND OF THE INVENTION

This invention relates to frequency synthesizers for wireless communications equipment and more particularly to such devices that include provisions for assuring the frequency synthesizer is generating the desired frequency prior to allowing, for example, the transmission of a radio frequency carrier.

Modern day wireless communications equipment often need the capability to routinely, rapidly, and reliably change between any two of, for example, a large number of potential radio frequency carriers with specific system critical parameters. This capability makes it possible to utilize efficient, high capacity, wireless communications technologies such as cellular telephone or trunked radio systems. This type of system, in turn, makes it feasible to satisfy, to a greater extent, the exploding demands of the wireless communications markets with a largely fixed frequency spectrum allocation.

The frequency synthesizer has enjoyed widespread usage and provides an economically effective way of generating, and rapidly changing between any two of, a large number of radio frequency carriers with desired parameters. To generate a specific radio frequency carrier, the frequency synthesizer must be programmed with an instruction corresponding to the desired radio frequency carrier. Some time after being programmed, depending on its dynamic characteristics, the frequency synthesizer should "LOCK" to the desired radio frequency carrier. To change the radio frequency carrier, the synthesizer must be reprogrammed, and allowed to "LOCK", to the new frequency. During this time the frequency synthesizer will be generating undesired, i.e., unauthorized, and often system-detrimental carrier frequencies. In an effort to avoid some problems associated with the above, prior devices simply presume the synthesizer has been correctly programmed and utilize an out-of-lock indication to preclude transmission until the synthesizer is actually locked.

This, however, may well present a problem. If the programming accuracy presumption is in fact incorrect but nevertheless the synthesizer locks to a frequency, the equipment may be allowed to transmit on either an unauthorized frequency or, almost certainly, a system-detrimental frequency. This situation could occur in any number of ways, including, a temporary or permanent hard fault in the programming system, or a soft fault such as, controller software errors or other possibly indeterminate, intermittent causes. The net effect of these problems is almost certainly communications failure for the user of the faulty piece of equipment and very likely other users, if the equipment is allowed to transmit on an undesired frequency. Indirectly, burdens may be imposed on all users while the system attempts to compensate for the errant equipments behavior.

To eliminate part of these problems, such as a permanent hard fault, known prior devices have used an approach whereby the synthesizer is first programmed to a non-useful frequency, allowed to lock, and then programmed to the desired frequency. By monitoring an out-of-lock detector for an "unlock," "lock," "unlock," and finally "LOCK" sequence of indications, a reasonable implication that the programming system is functioning, at least in part, can be made. This approach, while helpful, does not protect against soft or other indeterminate errors and is completely contrary to the requirement of rapidly changing to the new frequency.

Today's system requirements, routinely changing operating frequencies with flexible parameters, have dramatically increased the amount of information which must be successfully programmed. This only exacerbates an already potentially serious problem.

From the above it will be appreciated that a need exists for a frequency synthesizer programming system which provides enhanced assurance that the frequency synthesizer is locked on the desired frequency at all times and under all operating conditions.

SUMMARY OF THE INVENTION

This invention solves the aforementioned needs by providing a programmable frequency synthesizer arrangement having a programming feedback capability that is adaptable to avoid undesirable operation due to random hard and soft faults. The arrangement includes generating appropriate programming information for controlling the operation of the associated frequency synthesizer, receiving the programming information and, subject to the occurrence of random hard or soft faults, directing the operation of the frequency synthesizer, and then generating a feedback signal indicative of the programming information applied to the frequency synthesizer. A deterrence function generates a reference signal indicative of the appropriate programming information, compares this signal with the feedback signal, and then provides blocking of further undesirable operation of the frequency synthesizer whenever the above comparison indicates the occurrence of a random hard or soft fault.

BRIEF DESCRIPTION OF THE DRAWINGS

The features of the present invention which are believed to be novel are set forth with particularity in the appended claims. The invention, itself, however together with further advantages thereof, may best be understood by reference to the accompanying drawings in which:

DETAILED DESCRIPTION

Figure 1:
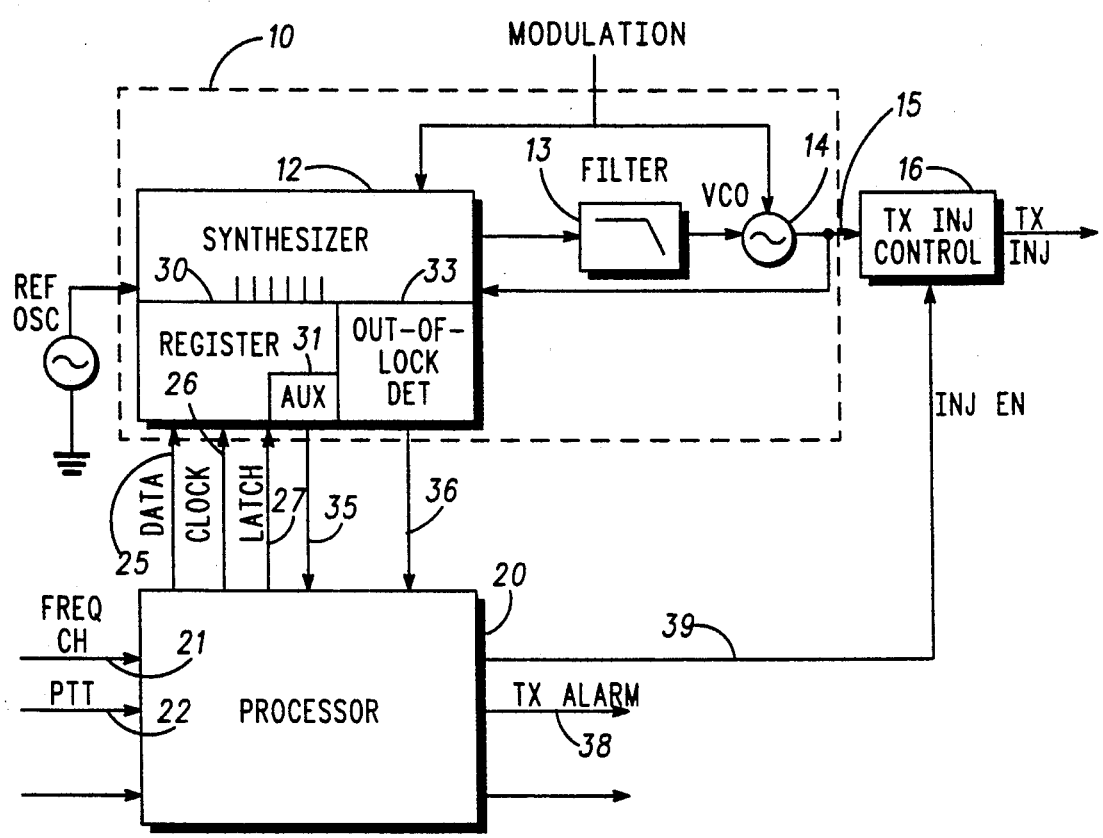
FIG. 1 is a diagram of a programmable frequency synthesizer arrangement in accordance with one embodiment of the present invention.

Referring to FIG. 1, a frequency synthesizer arrangement is illustrated generally, which synthesizer includes programming feedback capability in accordance with the present invention. A fully programmable frequency synthesizer (10) consisting of a logic circuit (12), loop filter (13), and voltage controlled oscillator (VCO) (14), interconnected in frequency synthesizer fashion, as depicted, is used to generate an appropriate frequency synthesizer signal (15). This signal is then coupled to an injection control block (16). A processor (20) consisting, for example, of one or more microprocessor systems, performs the remaining interface and controller duties associated with operating the frequency synthesizer (10) as, for example, a source from which transmitter radio frequency carriers are derived.

the processor (20), acting as a controller and responding to a programming request such as, for example, "Freq. Ch." (21) or "PTT" (22), initiates a programming task by generating appropriate programming information suitable for controlling the operation of the frequency synthesizer (10). This programming task includes composing the appropriate programming information and making it available, as, for example, serial data indicated at (25), a clock signal at (26), and a latch pulse at (27), to register (30). Register (30), part of the logic circuit (12), is adapted to receive the appropriate programming information and apply at least part of this information to direct the operation of the frequency synthesizer (10). The above described programming task, including its functions and procedures, may be subject to an occurrence of a random hard and/or soft fault, which fault, in turn, may cause undesirable operation of the frequency synthesizer.

To avoid this undesirable occurrence, logic circuit (12) acts to generate a feedback signal that is representative of the programming information as above applied. This feedback signal, is supplied by an "AUX" (31), coming from register (30), as well as that from out-of-lock detector (33), included as part of the logic circuit (12).

In response to the feedback signals (35, 36), a deterrence arrangement, embodied in processor (20), compares the feedback signal and a reference signal, derived from the appropriate programming information, and, based on this comparison, functions to block further undesirable operation of the frequency synthesizer (10). More particularly, processor (20) compares the "AUX" signal (35) to an expected value, the reference signal, and, further, confirms the absence of an out-of-lock indication (36). In the event the above comparison implies undesirable operation (occurrence of a fault) or an out-of-lock indication is detected, the processor (20) will operate to block undesirable operation of the frequency synthesizer (10) by, for example, setting an alarm (38), *not* enabling injection via the connection labelled "Inj. En." (39) and/or repetitively initiating the programming task. Thus, undesirable operation can be effectively avoided by detecting and correcting for soft (non recurring) faults or detected and disallowed if caused by hard (recurring) faults.

Figure 2:
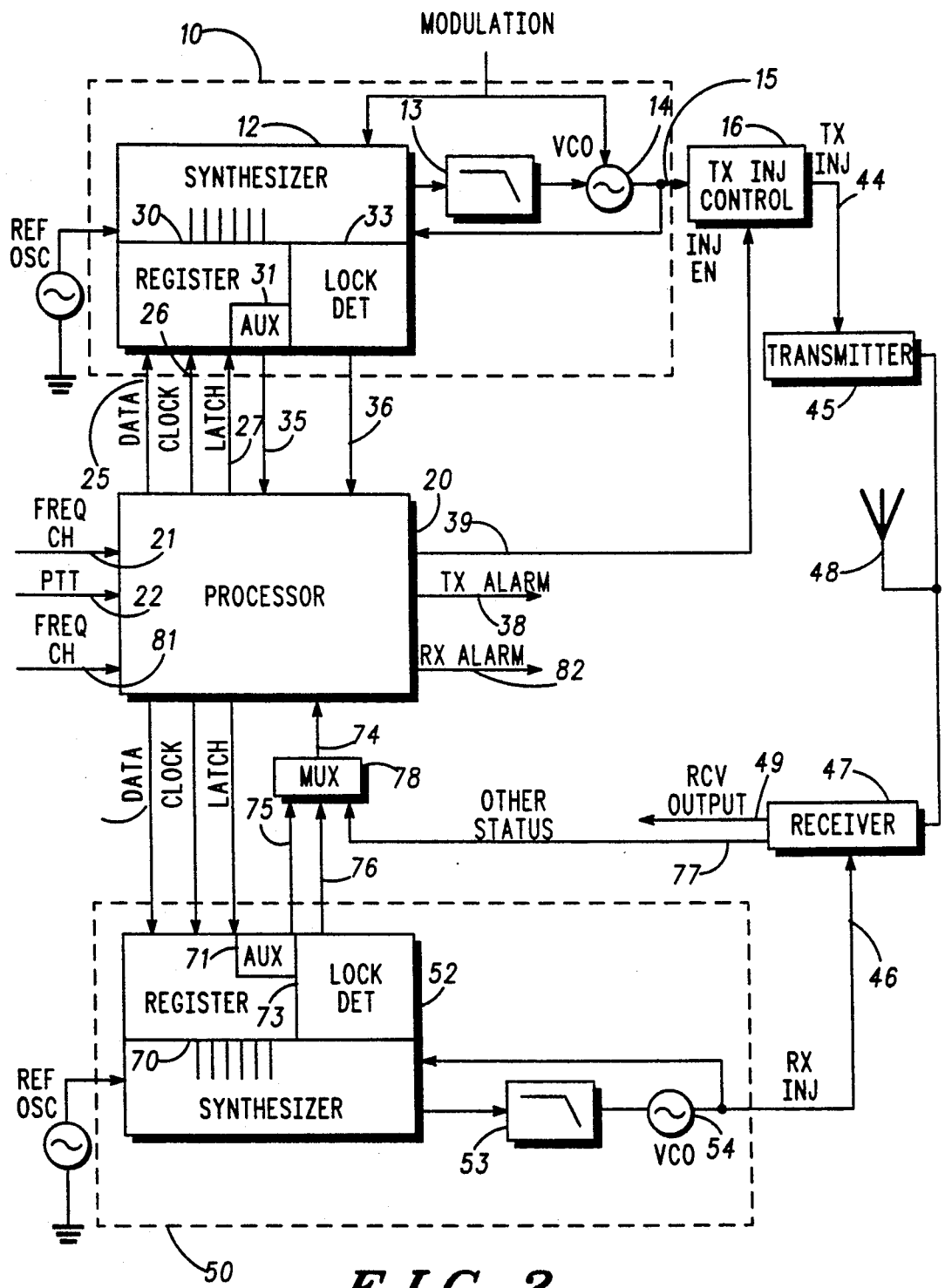
FIG. 2 is a diagram of a transceiver using the programmable frequency synthesizer of FIG. 1 in accordance with another embodiment of the present invention.

An additional embodiment of the present invention, as shown in FIG. 2, represents such a frequency synthesizer arrangement as adapted in a wireless communications system with an associated transmitter and receiver. Elements of FIG. 2 which are identical to FIG. 1 have like reference numerals. FIG. 2 includes frequency synthesizer (10) coupled by injection control block (16) providing a transmit injection signal (44) to transmitter (45) and a receive frequency synthesizer (50), adapted to provide a receive injection signal (46) to receiver (47). Transmitter (45) uses the transmit injection signal (44) to generate a corresponding desired transmit radio frequency carrier which is then coupled to antenna (48). Receiver (47), coupled to antenna (48), uses the receive injection signal (46) to receive a corresponding radio frequency carrier and provide a corresponding desired receiver output (49).

Processor (20) provides a programming task and a deterrence arrangement, in a similar manner as described with reference to FIG. 1, for both the transmit frequency synthesizer (10) and the receive frequency synthesizer (50). The receive frequency synthesizer (50) feedback signal (75, 76) is coupled at (74) to processor (20) along with other receiver status signals indicated at (77) via a multiplexer (78). Processor (20), having initiated a receive frequency synthesizer (50) programming task in response to, for example, a "Freq. Ch." (81), performs, in response to the feedback signal (75, 76), a receiver deterrence function in the manner described previously that may result in setting an "Rx. Alarm" (82) and/or repetitively initiating the programming task.

Figure 3:
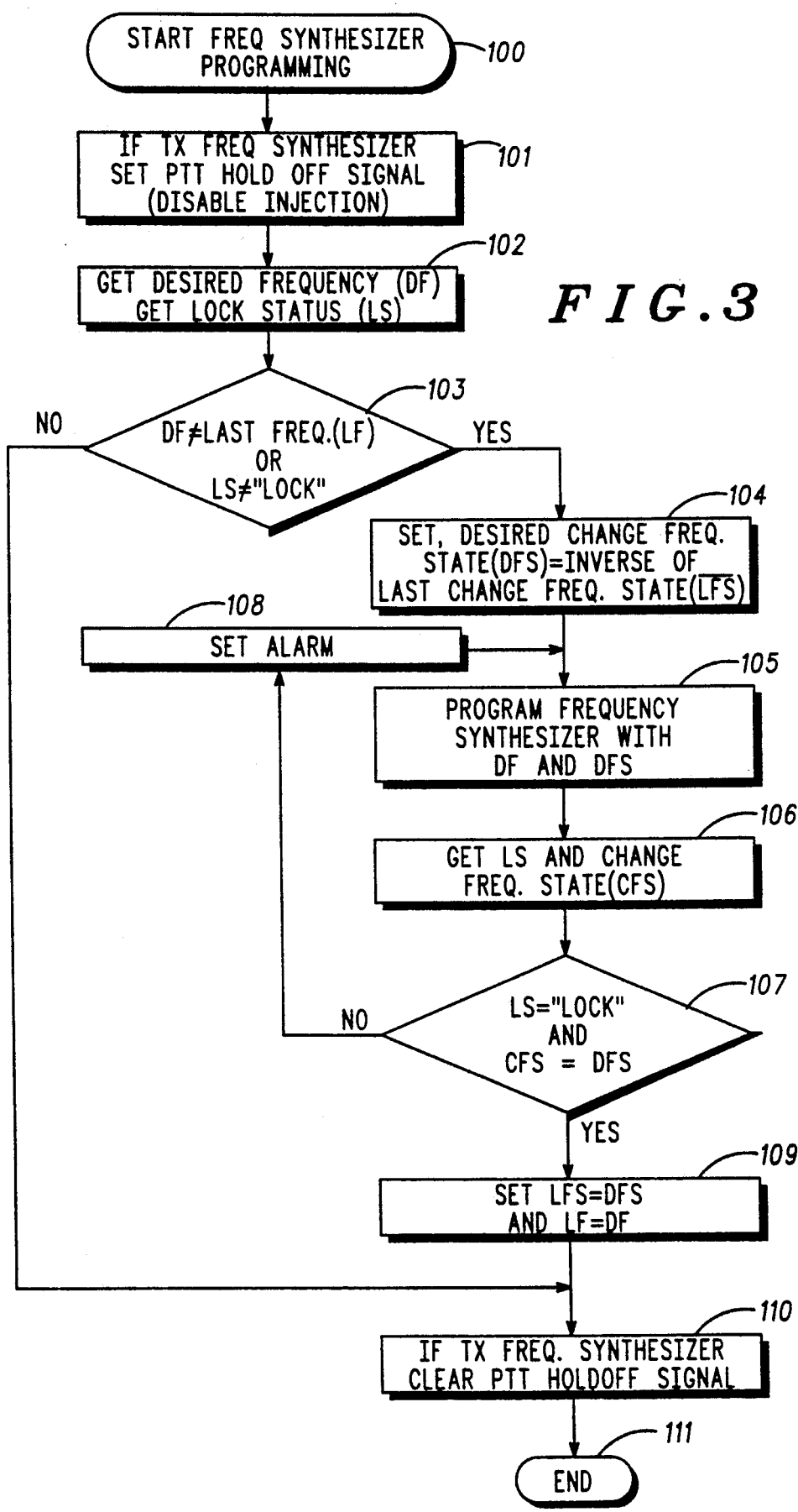
FIG. 3 is a diagram of a process flow chart in accordance with yet another embodiment of the present invention.

Appreciation of the present invention and its various embodiments can be enhanced by reviewing the simplified process flow diagram of FIG. 3. This process flow diagram is representative of a subroutine executed by processor (20) during the operation of the present invention. As indicated the frequency synthesizer initiates the start of programming at step (100). At step (101), if the transmit frequency synthesizer needs to be programmed, a PTT hold-off signal is set, thereby disabling the transmit injection signal (44) via the connection labelled "Inj. En." (39) and injection control block (16). Processor (20) may then obtain the desired frequency (DF) at step (102) from, for example, memory and the current appropriate out-of-lock indication (lock status) (LS) (36 or 76). At step (103), if LS="LOCK" and the last frequency (LF)=DF the left path designated "no" is followed to step (110).

If either above equality is not satisfied, processor (20), following the path designated "yes," may set a desired change frequency state (DFS) at step (104). DFS may be set equal to a value derived from DF, for example, a parity check, a cyclic redundancy code (CRC), bit by bit echo, or as depicted at step (104), a value derived from the last change frequency state (LFS), for example, the inverse of LFS. LFS is representative of the most recent appropriate "AUX" signal (35 or 75). Given an appropriate programming information, including DF and DFS from above, an attempt to program the frequency synthesizer (10 or 50) is made at step (105). This attempt includes processor (20) generating the appropriate programming information, register (30 or 70) receiving at least part of the same and in response thereto directing the operation of the appropriate frequency synthesizer (10 or 50) and, further, generating a feedback signal (specifically "AUX" (31 or 71) supplies a change frequency state (CFS) and the out-of-lock detector (33 or 73) supplies LS representative of the programming information as above applied for directing the operation of the frequency synthesizer. Processor (20) next assumes a deterrence arrangement whereby the feedback signal, specifically CFS (35 or 75) and LS (36 or 76), is retrieved at step (106) and compared to a generated reference signal indicative of the programming information, specifically DFS and "LOCK", at step (107).

If either equality (DFS=CFS, "LOCK"=LS) fails, processor (20) may set the appropriate alarm (38 or 82) at step (108) and then repeat steps (105, 106, and 107). Thus, processor (20), acting as a deterrence arrangement, is blocking further undesirable operation of the frequency synthesizer whenever the above comparison indicates the occurrence of a random hard or soft fault that has corrupted the appropriate programming information. If the step (107) equalities are satisfied, the path designated "yes" is taken to step (109) where LFS and LF are set equal to DFS and DF respectively. At this point in the process the programmable frequency synthesizer arrangement using programming feedback has determined that the frequency synthesizer programming was properly performed. At step (110) if a transmit frequency synthesizer was being programmed the PTT hold-off signal is cleared and "Inj En. (39)" is now subject to PTT (22) control.

What is claimed is:

1. A programmable frequency synthesizer arrangement having a programming feedback capability, adaptable to avoid undesirable operation due to random hard and soft faults, comprising:

controller means, responsive to a programming request, for generating appropriate programming information suitable for controlling an operation of a programmable frequency synthesizer, said operation including generation of a desired frequency signal;

means, coupled to said controller means and said programmable frequency synthesizer, for receiving said programming information and directing, in response thereto, said operation of said programmable frequency synthesizer, which information is susceptible to corruption due to an occurrence of a random hard or soft fault within the synthesizer arrangement;

said means for receiving further generating a feedback signal representative of said programming information as applied to said programmable frequency synthesizer, said feedback signal coupled to said controller means; and deterrence means, coupled to said controller means, for generating a reference signal indicative of said programming information, comparing said reference signal to said feedback signal to provide a comparison, and then blocking an undesirable operation of said programmable frequency synthesizer whenever said comparison indicates said occurrence of said random hard or soft fault.

2. A frequency synthesizer arrangement in accordance with claim 1 wherein said controller means includes a processor.

3. A frequency synthesizer arrangement in accordance with claim 1 wherein said appropriate programming information includes information indicative of a desired frequency synthesizer signal and an expected feedback signal.

4. A frequency synthesizer arrangement in accordance with claim 1 wherein said appropriate programming information corresponds, in part, to a preceding feedback signal.

5. A frequency synthesizer arrangement in accordance with claim 1 wherein said controller means, responding to said deterrence means, will generate said appropriate programming information repetitively.

6. A frequency synthesizer arrangement in accordance with claim 5 wherein said deterrence means operates to set an alarm whenever said comparison indicates the occurrence of a random hard or soft fault.

7. A frequency synthesizer arrangement in accordance with claim 6 wherein said deterrence means operates to disable a frequency synthesizer signal until said comparison is consistent with said appropriate programming information.

8. A wireless communications transceiver with a programmable frequency synthesizer arrangement having a programming feedback capability, adaptable to avoid undesirable transceiver operation due to random hard and soft faults occurring during programming of a programmable frequency synthesizer, comprising:

transmitting means for applying a first radio frequency carrier to an associated antenna;

receiver means for receiving a second radio frequency carrier from said antenna; and synthesis means, coupled to said transmit means and to said receiver means, for synthesizing, respectively, a transmit injection signal and a receive injection signal, and further including;

controller means, responsive to a programming request, for generating appropriate programming information suitable for controlling an operation of the programmable frequency synthesizer, said operation including generation of a desired frequency signal, means, coupled to said controller means and the programmable frequency synthesizer, for receiving said programming information and directing, in response thereto, said operation of the programmable frequency synthesizer, which information is susceptible to corruption due to an occurrence of a random hard or soft fault within the synthesizer arrangement, said means for receiving further generating a feedback signal representative of said programming information as applied to the programmable frequency synthesizer for said directing said operation of the programmable frequency synthesizer, said feedback signal coupled to said controller means, and deterrence means, coupled to said controller means, for generating a reference signal indicative of said programming information, comparing said reference signal to said feedback signal to provide a comparison, and then blocking an undesirable transceiver operation whenever said comparison indicates said occurrence of said random hard or soft fault.

9. A wireless communications transceiver in accordance with claim 8 wherein said appropriate programming information includes information indicative of a desired injection signal and an expected feedback signal.

10. A wireless communications transceiver in accordance with claim 8 wherein a appropriate programming information corresponds, in part, to a preceding feedback signal.

11. A wireless communications transceiver in accordance with claim 8 wherein said controller means, responding to said deterrence means, will supply said appropriate programming information repetitively.

12. A wireless communications transceiver in accordance with claim 11 wherein said deterrence means operates to set an alarm whenever said comparison indicates the occurrence of a random hard or soft fault.

13. A wireless communications transceiver in accordance with claim 12 wherein said deterrence means operates to disable an injection signal until said comparison is consistent with said appropriate programming information.

14. In a programmable frequency synthesizer arrangement having a programming feedback capability, a method of avoiding undesirable operation due to random hard and soft faults, comprising the steps of:

generating, in response to a programming request, appropriate programming information suitable for controlling an operation of a programmable frequency synthesizer, said operation including generation of a desired frequency signal;

receiving said programming information and directing, in response thereto, said operation of said programmable frequency synthesizer, which information is susceptible to corruption due to an occurrence of a random hard or soft fault within the synthesizer arrangement;

further generating a feedback signal representative of said programming information as applied to said programmable frequency synthesizer for said directing said operation of said frequency synthesizer;

developing a reference signal indicative of said programming information;

comparing said reference signal to said feedback signal to provide a comparison; and blocking an undesirable operation of said programmable frequency synthesizer whenever said comparison indicates said occurrence of said random hard or soft fault.

15. A method in accordance with claim 14 including the step of composing said appropriate programming information to include information indicative of a desired frequency synthesizer signal and an expected feedback signal.

16. A method in accordance with claim 15 wherein said appropriate programming information corresponds, in part, to a preceding said feedback signal.

17. A method in accordance with claim 14 wherein said step of blocking further includes the step of setting an alarm whenever said comparison indicates the occurrence of a random hard or soft fault.

18. A method in accordance with claim 17 wherein said step of blocking further includes the step of repeating said step of generating appropriate programming information.

19. A method in accordance with claim 18 wherein said step of blocking further includes the step of disabling a frequency synthesizer signal until said comparison is consistent with said appropriate programming information.

* * * * *